(12) United States Patent
Nomura et al.

(10) Patent No.: US 7,790,485 B2
(45) Date of Patent: Sep. 7, 2010

(54) SEMICONDUCTOR LIGHT EMITTING DEVICE AND METHOD OF MANUFACTURING THE SAME

(75) Inventors: Yuko Nomura, Kawasaki (JP); Kenichi Mori, Yokohama (JP); Isao Takasu, Komae (JP); Keiji Sugi, Fujisawa (JP); Isao Amemiya, Machida (JP); Miho Yoda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 176 days.

(21) Appl. No.: 12/122,446

(22) Filed: May 16, 2008

(65) Prior Publication Data
US 2009/0020773 A1 Jan. 22, 2009

(30) Foreign Application Priority Data
May 18, 2007 (JP) .......................... P2007-132553

(51) Int. Cl.
*H01L 21/00* (2006.01)
(52) U.S. Cl. .............................. 438/27; 438/29; 257/95; 257/E33.061
(58) Field of Classification Search .................. 438/22, 438/27, 29; 257/95, E33.061, E33.073, E33.068
See application file for complete search history.

(56) References Cited
U.S. PATENT DOCUMENTS
6,155,699 A * 12/2000 Miller et al. ................. 362/293

2009/0021140 A1 1/2009 Takasu et al.
2009/0179213 A1 * 7/2009 Cannon et al. ................. 257/98

FOREIGN PATENT DOCUMENTS

| JP | 6-238884 | 8/1994 |
|---|---|---|
| JP | 8-99408 | 4/1996 |
| JP | 2004-80058 | 3/2004 |
| JP | 2004-186488 | 7/2004 |
| JP | 2005-276883 | 10/2005 |
| JP | 2006-24615 | 1/2006 |
| JP | 2006-92983 | 4/2006 |

* cited by examiner

*Primary Examiner*—Thien F Tran
(74) *Attorney, Agent, or Firm*—Finnegan, Henderson, Farabow, Garrett & Dunner, L.L.P.

(57) ABSTRACT

A method of manufacturing a semiconductor light emitting device. The method includes: mounting a semiconductor light emitting element on a flat substrate; covering the semiconductor light emitting element on the flat substrate by a cover layer in a domed shape to form a light emitting device, the cover layer including at least a phosphor layer and a coating resin layer that are laminated in order, so as to fill around the semiconductor light emitting element; measuring an emission condition of the light emitting device; and forming a convex lens unit on the outermost of the coating resin layer using a liquid droplet discharging apparatus to adjust an emission distribution of the light emitting device based on the measured emission condition.

5 Claims, 5 Drawing Sheets

SEMICONDUCTOR LIGHT EMITTING DEVICE AND METHOD OF MANUFACTURING THE SAME

The entire disclosure of Japanese Patent Application No. 2007-132553 filed on May 18, 2007 including specification, claims, drawings and abstract is incorporated herein by reference in its entirety.

BACKGROUND OF THE INVENTION

1. Field of the Invention

The present invention relates to a semiconductor light emitting device including semiconductor light emitting elements mounted on a flat substrate, and a method of manufacturing the same.

2. Description of the Related Art

LED lamps employing light emitting diodes can be realized with different light emission colors by a combination of light emitting diodes as an excitation light source and phosphors. Among methods of achieving a light emitting device that emits white color light, which is referred to as a white LED, there have been known a method of combining a light emitting diode that mainly emits blue color light and a yellow phosphor and a method of combining a light emitting diode that emits a near-ultraviolet ray, a blue phosphor, a green phosphor and a red phosphor.

In recent years, white LEDs have been employed as light sources of illumination systems, display systems and the like. However, in such employment of white LEDs, there remain issues of emission irregularity of light emitting elements themselves, emission irregularity caused by mounting such as wire bonding, etc., thus requiring improvement of characteristics of light emitting elements.

To avoid such issues, there has been known a technique of flip chip mounting without requiring wires disturbing an optical path and a technique related to a phosphor layer or a resin layer. See JP-A-2006-92983, JP-A-2005-276883, JP-A-2006-24615, JP-A-2004-80058, JP-A-2004-186488, JP-A-6-238884 and JP-A-8-99408.

Although a flip chip mounting used in a wide range has advantages of short wiring, good electrical property and a small mounting area over a wire bonding, the flip chip mounting has disadvantages of a complicated structure and high costs.

Techniques disclosed in JP-A-2006-92983 and JP-A-2005-276883 attempt to increase emission efficiency and provide uniform emission using unevenness formed in a phosphor layer. However, in the technique disclosed in JP-A-2006-92983, correction is not made based on emission irregularity of light emitting elements and also it can not be said that emission efficiency of all semiconductor light emitting devices are not necessarily increased. In addition, in the technique disclosed in JP-A-2005-276883, although thickness of a phosphor layer is changed based on emission irregularity of light emitting elements, since the phosphor is formed in combination with a second sealing resin member made in a different process, a manufacturing process is complicated.

In the technique disclosed in JP-A-2006-24615, unevenness is formed on a top surface using a print method to increase light output efficiency. However, the print method used herein is meant to be a stencil print method to require a stencil plate, so it is difficult to make correction to irregularity of individual semiconductor light emitting devices. In addition, in the technique disclosed in JP-A-2006-24615, although unevenness may be formed in a lateral side in addition to the top surface, it is difficult to maintain high precision of unevenness due to friction which may occur when semiconductor light emitting devices are peeled out of a stencil plate.

In techniques disclosed in JP-A-2004-80058 and JP-A-2004-186488, a light emission state is measured, and correction is made to irregularity of individual semiconductor light emitting devices using a liquid droplet discharging apparatus. However, a surface mounting LED package shown herein, which is a combination of a cup-shaped substrate and a resin filler, has disadvantages of requirement of substrate processing, complicated processes, and high costs. In addition, JP-A-2004-80058 and JP-A-2004-186488 disclose only an application to cup-shaped LEDs, but do not show a detailed application to a flat substrate.

SUMMARY OF THE INVENTION

The invention provides a method of manufacturing a semiconductor light emitting device, including: mounting a semiconductor light emitting element on a flat substrate; covering the semiconductor light emitting element on the flat substrate by a cover layer in a domed shape to form a light emitting device, the cover layer including at least a phosphor layer and a coating resin layer that are laminated in order, so as to fill around the semiconductor light emitting element; measuring an emission condition of the light emitting device; and forming a convex lens unit on the outermost of the coating resin layer using a liquid droplet discharging apparatus to adjust an emission distribution of the light emitting device based on the measured emission condition.

BRIEF DESCRIPTION OF THE DRAWINGS

Embodiment may be described in detail with reference to the accompanying drawings, in which.

DETAILED DESCRIPTION OF THE INVENTION

Figure 1:
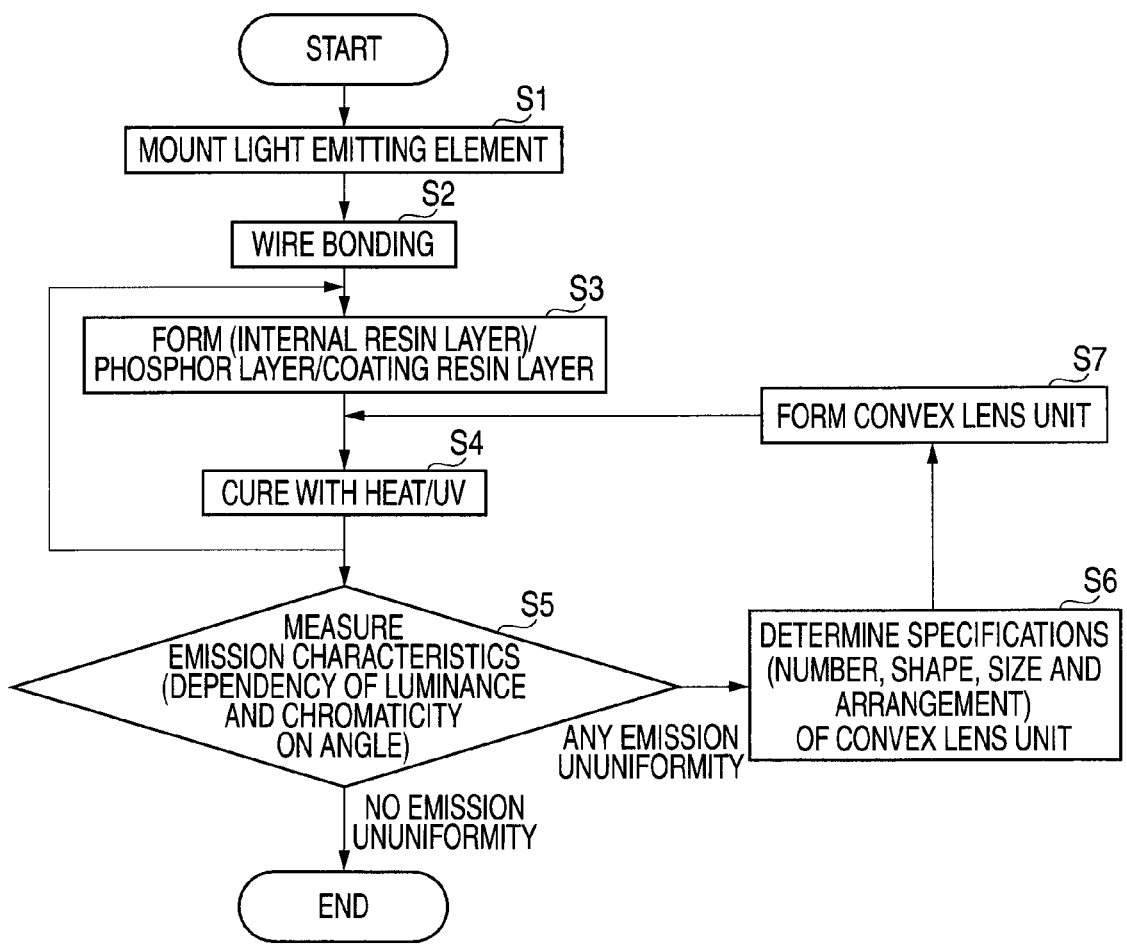
FIG. 1 is a flow chart showing a method of manufacturing a semiconductor light emitting device according to an embodiment.

Hereinafter, a semiconductor light emitting device and a method of manufacturing the same will be described as an illustrative embodiment of the invention with reference to the accompanying drawings. Throughout the drawings, the same or similar components are designated by the common reference numerals, and duplicate explanation of which will be omitted.

Figure 2:
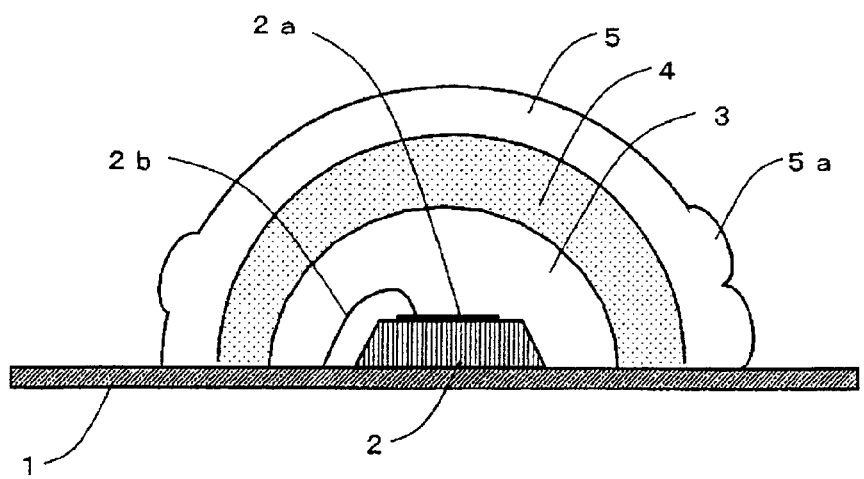
FIG. 2 is an elevation section view of a semiconductor light emitting device according to an embodiment.

FIG. 1 is a flow chart for illustrating a method of manufacturing a semiconductor light emitting device according to an embodiment of the invention. FIG. 2 is an elevation sectional view of a semiconductor light emitting device according to an embodiment of the invention, which is produced by the method of FIG. 1, and FIG. 3 is a perspective view of the semiconductor light emitting device.

Figure 3:
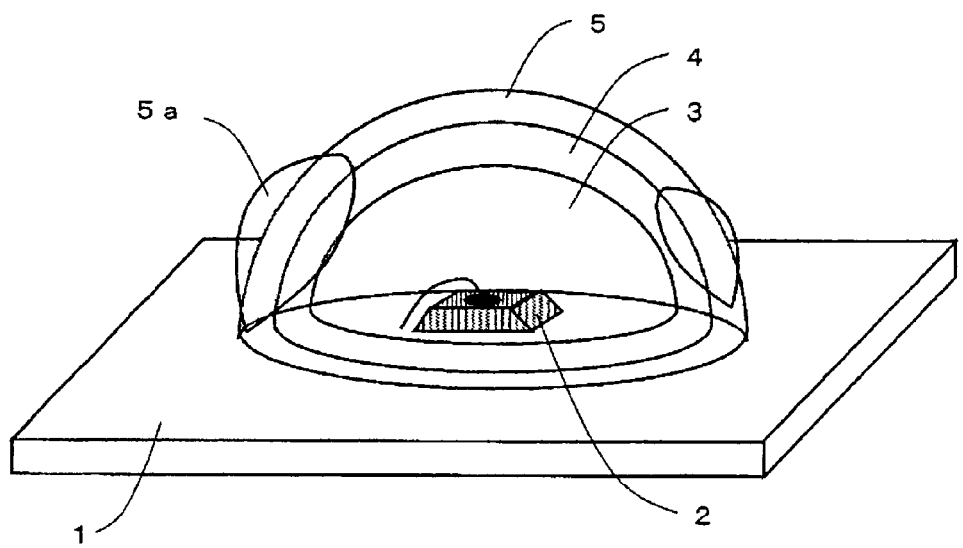
FIG. 3 is a perspective view of the semiconductor light emitting device of FIG. 1.

As shown in FIGS. 2 and 3, a semiconductor light emitting device according to an embodiment of the invention includes a flat substrate 1, a light emitting element 2 mounted on the flat substrate 1, an internal resin layer 3 configured to cover the light emitting element 2, a phosphor layer 4 configured to cover the internal resin layer 3, and a coating resin layer 5 configured to cover the phosphor layer 4. A convex lens unit 5a is partially formed on an outer surface of the coating resin layer 5. A light emitting element electrode 2a is attached to the top surface of the light emitting element 2 and a boding wire 2b is connected to the light emitting element electrode 2a.

Next, a method of manufacturing the semiconductor light emitting device as constructed above will be described with reference to FIG. 1.

First, the light emitting device 2 is mounted on the flat substrate 1 by means of Ag paste or the like (Step S1). An example of the light emitting element 2 may include an element which emits a near-ultraviolet ray, an element which emits visible light, etc. For example, a semiconductor light emitting diode of GaAs, GaN or the like may be used as the light emitting element 2. Next, a lead (not shown) is connected to the electrode 2a provided on the top surface of the light emitting element 2 by a bonding wire 2b composed of Au or the like (wire bonding step, Step S2). In this case, the wire bonding may be replaced with flip chip mounting.

Next, the internal resin layer 3, the phosphor layer 4 and the coating resin layer 5 are sequentially formed to cover the light emitting element 2 (Step S3). Specifically, first, the internal resin layer 3 is formed to cover the light emitting element 2. For example, silicon resin, epoxy resin, fluorine resin or the like may be used for the internal resin layer 3. However, an organic polymer material such as epoxy resin is apt to be deteriorated due to an LED light source and may be discolored when it is used for a long time. Therefore, it is desirable to use silicon resin for the internal resin layer 3. The resin used for the internal resin layer 3 may be either an UV curable type or a thermosetting type, or either a single liquid type or a two-liquid mixed type.

Next, the phosphor layer 4 is laminated on an outer side of the internal resin layer 3. The phosphor layer 4 may be formed by dispersing a phosphor into the resin, for example, silicon resin, used for the internal resin layer 3. An example of the phosphor used may include a combination of blue phosphor, green phosphor and red phosphor if the light emitting element 2 is to emit a near-ultraviolet ray, a combination of yellow phosphor or green phosphor, red phosphor and orange phosphor if the light emitting element 2 is to emit blue color light, etc.

Next, the coating resin layer 5 is laminated on an outer side of the phosphor layer 4. The same material as or material different from the internal resin layer 3 may be used for the coating resin layer 5.

Although the three-layered structure of the internal resin layer 3, the phosphor layer 4 and the coating resin layer 5 is preferable in respect of high durability and suppression of chromaticity unevenness, a two-layered structure in which the phosphor layer 4 is directly coated on the light emitting element 2 without providing the internal.

Next, the internal resin layer 3, the phosphor layer 4 and the coating resin layer 5 are cured (Step S4). Although it is illustrated in FIG. 1 that the internal resin layer 3, the phosphor layer 4 and the coating resin layer 5 are collectively cured, these layers 3, 4 and 5 may be cured whenever each of these layer 3, 4 and 5 is formed. These layers 3, 4 and 5 may be cured using any method suitable for the material used, such as, for example, heating, UV irradiation or the like. If these layers 3, 4 and 5 are to be collectively cured, the flat substrate 1 may be preheated or irradiated with weak UV to make each layer preliminarily cured so that these layers 3, 4 and 5 can maintain their respective good performance without being mixed with each other.

The semiconductor light emitting device formed according to the above-described processes may be formed by means of a molding method known in the art or by means of a liquid droplet discharging apparatus which is employed here. The liquid droplet discharging apparatus described here corresponds to an apparatus which is capable of coating a material, which is to be discharged, in a non-contact manner on demand, such as, for example, an inkjet apparatus or the like.

Thereafter, emission characteristics (for example, dependency of luminance and chromaticity on an angle) of the semiconductor light emitting device formed above are measured (Step S5). If a result of the measurement shows uniform emission conditions, it is proved that the semiconductor light emitting device has desired good quality, and its manufacturing process is ended. Otherwise, if the result of the measurement shows nonuniform emission conditions or undesired directionality of distributed light, specifications of the convex lens unit 5a to be formed on the outermost of the coating resin layer 5 using the liquid droplet discharging apparatus in order to adjust the nonuniform emission conditions are determined (Step S6). In more detail, number, shape, size and arrangement of the convex lens unit 5a are determined based on the result of the measurement with reference to data stored in a database. Then, the convex lens unit 5a is formed according to the determined specifications (Step S7).

FIGS. 2 and 3 show a half-ellipsoidal convex lens unit 5a. An effect that the amount of light is reduced due to light in the vicinity of the boding wire 2b, which induces a shadow of the bonding wire 2b, may be alleviated by the convex lens unit 5a provided in the vicinity of the boding wire 2b.

Although the convex lens unit 5a formed on the coating resin layer 5 may made of the same material as the coating resin layer 5, if emission colors are nonuniform, the convex lens unit 5a may be made of a material including a phosphor for the purpose of achieving uniformity of the emission colors.

As described above, the optimal specifications of number, shape, size and arrangement of the convex lens unit 5a are determined based on a result of measurement for emission conditions of individual semiconductor light emitting devices, and the convex lens unit 5a is formed according to the determined specifications. The convex lens unit 5a may be formed using a liquid droplet discharging apparatus known in the art, such as an inkjet apparatus or the like.

Here, higher viscosity of the material used for the convex lens unit 5a provides more stable shape of the convex lens unit 5a. For example, viscosity of the material used for the convex lens unit 5a is preferably several tens to several thousands mPa·s. In general, it is difficult to discharge such a material by means of a typical liquid droplet discharging apparatus using a piezoelectric force or a bubble force, and it is preferable to discharge such a material by means of a liquid droplet discharging apparatus using a converged ultrasonic wave (see JP-A-6-238884 and JP-A-8-99408). This allows a material having high viscosity to be discharged on demand. Since the liquid droplet discharging apparatus using the converged ultrasonic wave has a structure that does not require any nozzle which is the main cause of ink clogging, this apparatus can discharge materials including large particles having a diameter of more than 10 µm as well as the material high viscosity.

Figure 4:
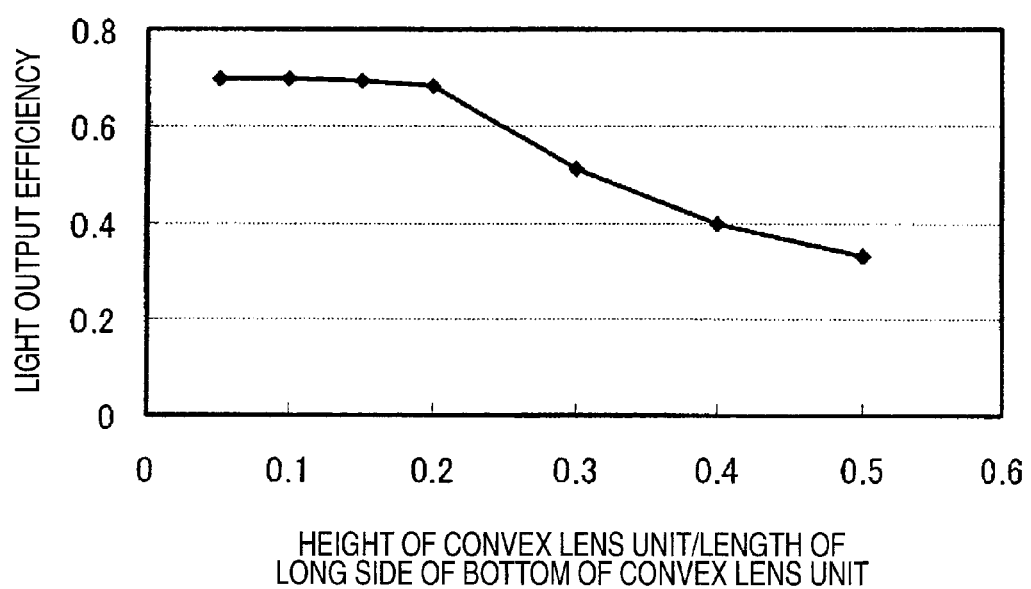
FIG. 4 is a graph showing a relationship between a shape of a convex lens unit and light output efficiency in a semiconductor light emitting device according to an embodiment.

FIG. 4 is a graph showing a relationship between a ratio between a height of the convex lens unit 5a and a length of a long side of the bottom of the convex lens unit 5a, and light output efficiency of the semiconductor light emitting device, the relationship being obtained through a simulation. A result of this simulation shows that the light output efficiency is sharply decreased with increase of total reflection components in the convex lens unit 5a if the ratio between the height of the convex lens unit 5a and the length of the long side of the bottom of the convex lens unit 5a is more than 0.2. It can be seen from this result that the convex lens unit 5a preferably has a half-ellipsoidal shape as shown in FIGS. 2 and 3.

Figure 5:
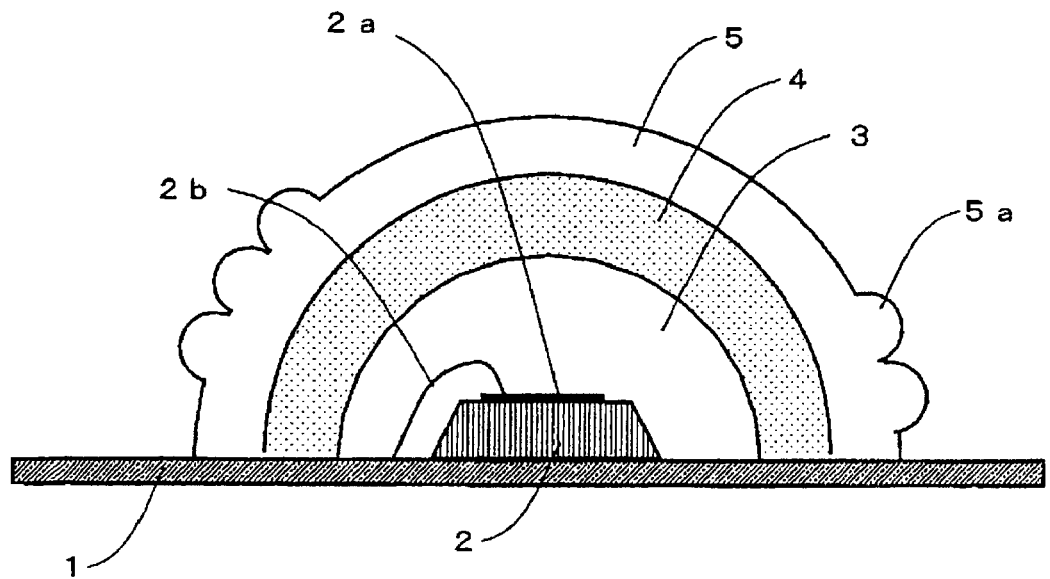
FIG. 5 is an elevation section view of a semiconductor light emitting device according to another embodiment.
Figure 6:
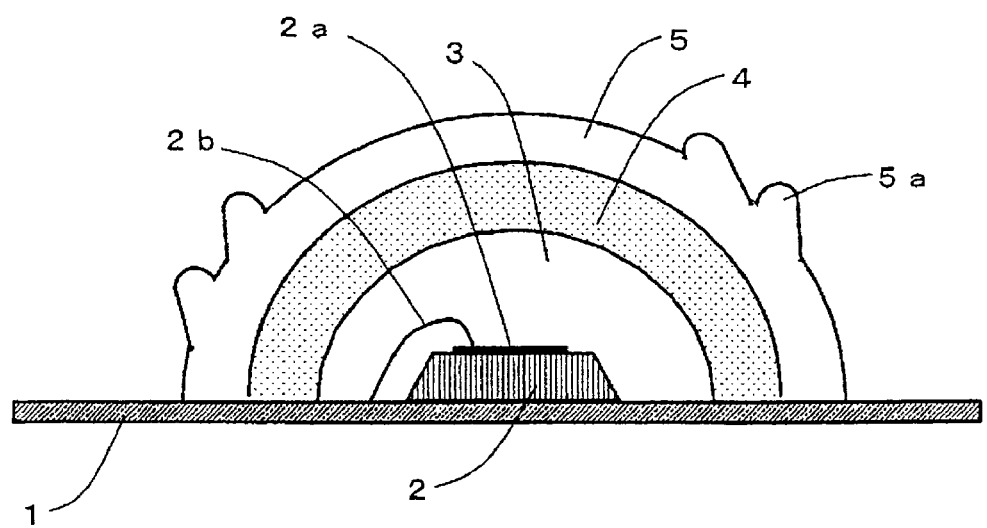
FIG. 6 is an elevation section view of a semiconductor light emitting device according to still another embodiment.

FIGS. 5 and 6 are elevation sectional views of a semiconductor light emitting device according to another embodiment of the invention. FIG. 5 shows a convex lens unit 5a having a dome shape whose contour viewed from the outside is circular, and FIG. 6 shows a convex lens unit 5a having a spindle shape (a cone shape with a tapered end). In the case of the circular dome-shaped convex lens unit 5a, although it can be seen from the result of simulation as shown in FIG. 4 that its light output efficiency is increased, it is possible to suppress the overall emission nonuniformity when the amount of light is locally large. In the case of the spindle-shaped convex lens unit 5a as shown in FIG. 6, since light is diffused toward a convex portion, it is possible to control distribution of light on a top side.

Figure 7:
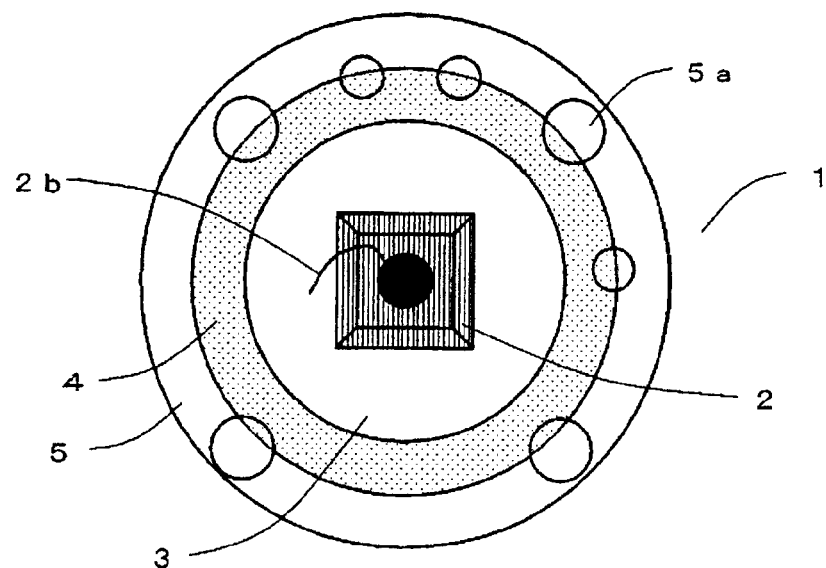
FIG. 7 is a top view of a semiconductor light emitting device according to still another embodiment.
Figure 8:
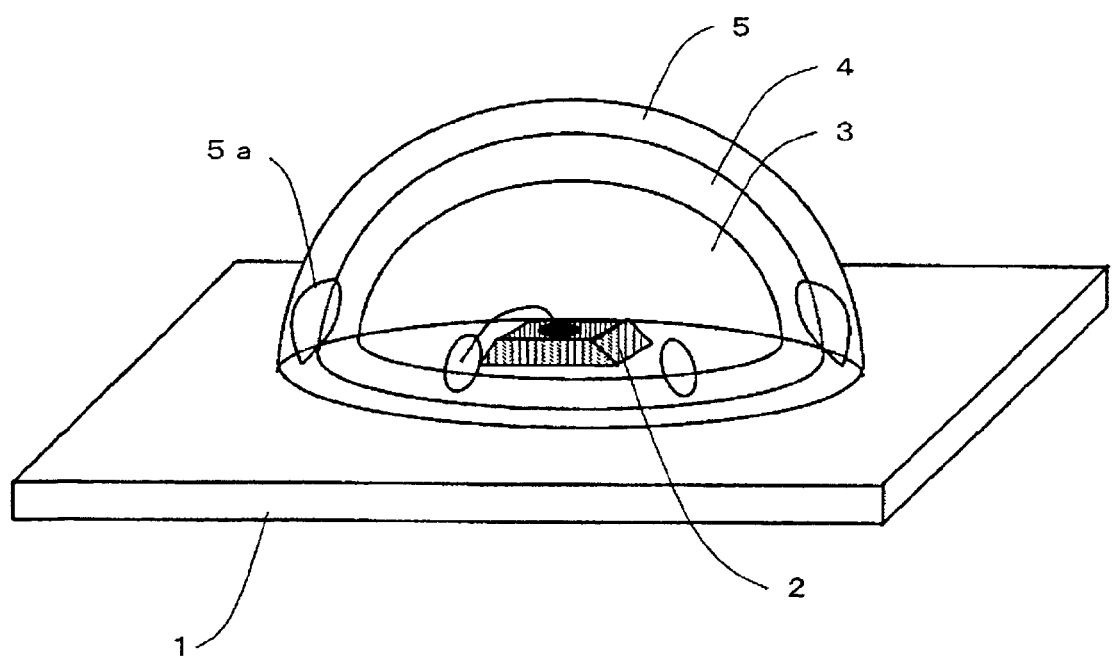
FIG. 8 is a perspective view of the semiconductor light emitting device of FIG. 7.

FIGS. 7 and 8 are a top view and a perspective view of a semiconductor light emitting device, respectively, according to still another embodiment of the invention. In this embodiment, the convex lens unit 5a is arranged near a boundary between the flat substrate 1 and the coating resin layer 5. With this arrangement, light emitted from the light emitting element 2 and traveling in a direction traverse to the semiconductor light emitting device (a direction parallel to a plane of the flat substrate 1) is efficiently focused in an upper direction (a direction perpendicular to the plane of the flat substrate 1), thereby providing directionality of distributed light.

Figure 9:
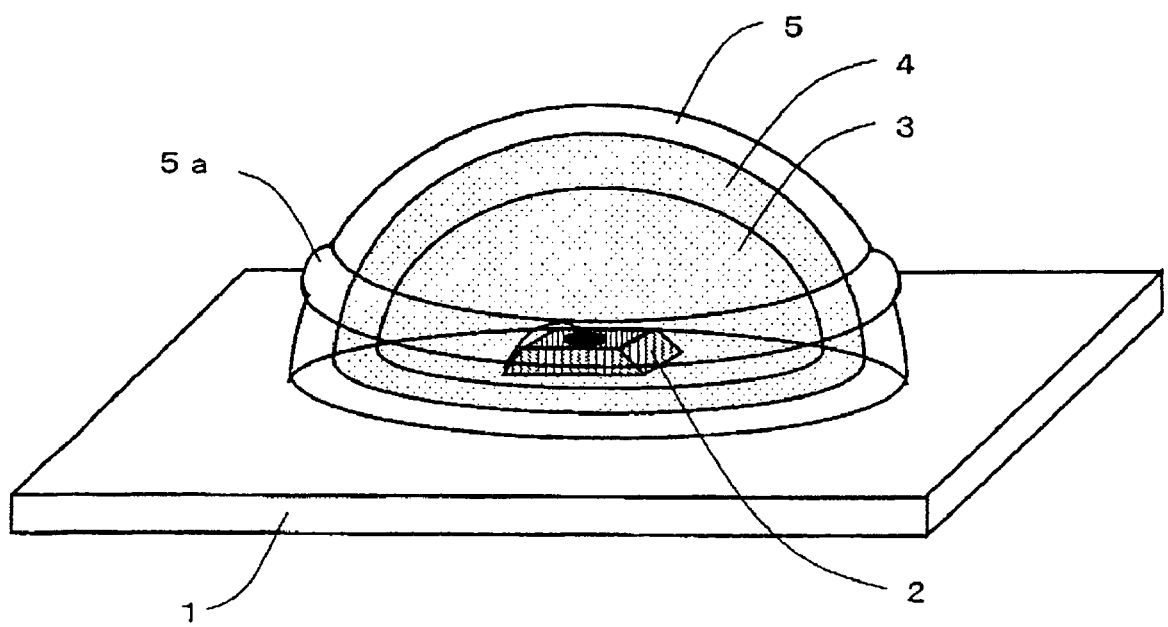
FIG. 9 is a perspective view of a semiconductor light emitting device according to still another embodiment.

FIG. 9 is a perspective view of a semiconductor light emitting device according to still another embodiment of the invention. In this embodiment, the convex lens unit 5a is configured to have a seamless band shape in parallel to a boundary between the flat substrate 1 and the coating resin layer 5. With this configuration, light emitted from the semiconductor light emitting device is focused on a top side.

What is claimed is:

1. A method of manufacturing a semiconductor light emitting device, comprising:
   mounting a semiconductor light emitting element on a flat substrate;
   covering the semiconductor light emitting element on the flat substrate by a cover layer in a domed shape to form a light emitting device, the cover layer including at least a phosphor layer and a coating resin layer that are laminated in order, so as to fill around the semiconductor light emitting element;
   measuring an emission condition of the light emitting device; and
   forming a convex lens unit on the outermost of the coating resin layer using a liquid droplet discharging apparatus to adjust an emission distribution of the light emitting device based on the measured emission condition.

2. The method according to claim 1,
   wherein the convex lens unit includes one or a plurality of convex lens elements; and
   the forming step comprises forming the convex lens elements whose shape, number, size and arrangement are determined based on the result of the measured emission condition.

3. The method according to claim 1,
   wherein the covering step comprises forming an internal resin layer laminated between the semiconductor light emitting element and the phosphor layer.

4. The method according to claim 1,
   wherein the forming step comprises discharging liquid droplets of transparent resin upward by the liquid droplet discharging apparatus using a convergent ultrasonic wave.

5. The method according to claim 1,
   wherein the forming step comprises forming the convex lens into a half-ellipsoidal shape.

* * * * *